(12) United States Patent
Umeda et al.

(10) Patent No.: US 11,414,554 B2
(45) Date of Patent: Aug. 16, 2022

(54) CONDUCTIVE COATING MATERIAL AND PRODUCTION METHOD FOR SHIELDED PACKAGE USING CONDUCTIVE COATING MATERIAL

(71) Applicant: TATSUTA ELECTRIC WIRE & CABLE CO., LTD., Higashiosaka (JP)

(72) Inventors: Hiroaki Umeda, Kizugawa (JP); Kazuhiro Matsuda, Kizugawa (JP); Ken Yukawa, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 232 days.

(21) Appl. No.: 16/088,213

(22) PCT Filed: Mar. 27, 2017

(86) PCT No.: PCT/JP2017/012373
§ 371 (c)(1),
(2) Date: Sep. 25, 2018

(87) PCT Pub. No.: WO2017/170390
PCT Pub. Date: Oct. 5, 2017

(65) Prior Publication Data
US 2020/0299524 A1    Sep. 24, 2020

(30) Foreign Application Priority Data

Mar. 29, 2016    (JP) .............................. JP2016-066379

(51) Int. Cl.
*C09D 5/24* (2006.01)
*C09D 7/61* (2018.01)
(Continued)

(52) U.S. Cl.
CPC .................. *C09D 5/24* (2013.01); *C09D 7/20* (2018.01); *C09D 7/61* (2018.01); *C09D 7/63* (2018.01);
(Continued)

(58) Field of Classification Search
CPC ... C09D 5/24; C09D 7/70; C09D 4/06; C09D 133/10; C09D 163/00; H01B 1/00; H01B 1/22; H01B 1/02
(Continued)

(56) References Cited

U.S. PATENT DOCUMENTS

2003/0160313 A1    8/2003  Ichihashi et al.
2006/0145125 A1    7/2006  Kuwajima et al.
(Continued)

FOREIGN PATENT DOCUMENTS

CN    1745437 A    3/2006
JP    2003-45228 A    2/2003
(Continued)

OTHER PUBLICATIONS

Office Action dated Sep. 17, 2020, issued in counterpart CN Application No. 201780020656.1, with English translation (18 pages).
(Continued)

*Primary Examiner* — Tri V Nguyen
(74) *Attorney, Agent, or Firm* — WHDA, LLP

(57) ABSTRACT

A conductive coating material is disclosed including at least (A) 100 parts by mass of a binder component including a solid epoxy resin that is a solid at normal temperature and a liquid epoxy resin that is a liquid at normal temperature, (B) 500 to 1800 parts by mass of metal particles that have a tap density of 5.3 to 6.5 g/cm$^3$ with respect to 100 parts by mass of the binder component (A), (C) 0.3 to 40 parts by mass of a curing agent that contains at least one imidazole type
(Continued)

curing agent with respect to 100 parts by mass of the binder component (A), and (D) 150 to 600 parts by mass of a solvent with respect to 100 parts by mass of the binder component (A).

17 Claims, 3 Drawing Sheets

(51) Int. Cl.
    *C09D 7/20*     (2018.01)
    *C09D 7/40*     (2018.01)
    *C09D 7/63*     (2018.01)
    *C09D 163/10*     (2006.01)
    *H01L 23/29*     (2006.01)
    *H01L 23/31*     (2006.01)
    *H05K 9/00*     (2006.01)
    *C08K 3/08*     (2006.01)
    *C08K 5/13*     (2006.01)
    *C08K 9/02*     (2006.01)

(52) U.S. Cl.
    CPC ............. *C09D 7/70* (2018.01); *C09D 163/10* (2013.01); *H01L 23/293* (2013.01); *H01L 23/31* (2013.01); *H05K 9/0081* (2013.01); *C08K 3/08* (2013.01); *C08K 5/13* (2013.01); *C08K 9/02* (2013.01); *C08K 2003/085* (2013.01); *C08K 2201/001* (2013.01); *C08K 2201/003* (2013.01)

(58) Field of Classification Search
    USPC ......... 252/512, 518.1, 519.3, 519.32, 519.33
    See application file for complete search history.

(56) References Cited

U.S. PATENT DOCUMENTS

| 2014/0326929 A1 | 11/2014 | Hsueh et al. |
| 2015/0171020 A1 | 6/2015 | Shibuya et al. |

FOREIGN PATENT DOCUMENTS

| JP | 2003-258137 A | | 9/2003 | |
| JP | 2004-47174 A | | 2/2004 | |
| JP | 2004-55543 A | | 2/2004 | |
| JP | 2005044524 A | * | 2/2005 | ............. C09J 11/04 |
| JP | 3923687 B2 | * | 6/2007 | ............. H01B 1/22 |
| JP | 2008-42152 A | | 2/2008 | |
| JP | 2011-151372 A | | 8/2011 | |
| JP | 2014-220238 A | | 11/2014 | |
| JP | 2015-115549 A | | 6/2015 | |
| KR | 20150123179 A | * | 11/2015 | ............. C08K 3/033 |

OTHER PUBLICATIONS

Office Action dated Mar. 26, 2020, issued in counterpart CN Application No. 201780020656.1, with English Translation. (14 pages).

International Search Report dated Jun. 6, 2017, issued in counterpart application No. PCT/JP2017/012373 (2 pages).

Office Action dated Jun. 9, 2021, issued in counterpart KR application No. 10-2018-7029254, with English translation. (9 pages).

* cited by examiner

CONDUCTIVE COATING MATERIAL AND PRODUCTION METHOD FOR SHIELDED PACKAGE USING CONDUCTIVE COATING MATERIAL

TECHNICAL FIELD

The present invention relates to a conductive coating material and a production method for a shielded package using the conductive coating material.

BACKGROUND ART

In recent years, in electronic devices such as portable telephones and tablet terminals, a lot of electronic parts for wireless communication to transmit high-volume data have been mounted. Such electronic parts for wireless communication have a problem in that the electronic parts not only easily generate noises but also are highly sensitive to noises, and, when exposed to noises from outside, the electronic parts are easily caused to carry out erroneous operations.

Meanwhile, in order to obtain miniaturization and weight reduction as well as high functions of electronic devices, it is required to increase mounting density of electronic parts. However, when the mounting density is increased, there occurs a problem in that not only electronic parts as sources for generating noises are increased but also electronic parts affected by the noises are increased.

In the related art, as means for solving the problem, a so-called shielded package that prevents generation of noises from an electronic part and prevents penetration of noises by covering the electronic part which is a source of generating noises with a shield layer for each package is known. For example, PTL 1 discloses that it is possible to easily obtain an electromagnetic shielded member with a high shielding effect by spraying a conductive or semi-conductive material on a surface of a package to coat it. However, in a case where a shield layer is formed by spray coating using a solution made of metal particles and a solvent, there is a problem in that favorable shielding properties are not obtained and adhesion between the shield layer and a package deteriorates.

In addition, as means for efficiently preparing a shielded package, for example, as disclosed in PTL 2, a method of preparing a circuit module is known that includes a step of covering a plurality of ICs with an insulating layer, a step of covering the insulating layer with a shield layer made of a conductive coating material, and a step of dividing a substrate in which the shield layer is formed (method of preliminarily forming a cut groove, of which a tip end portion has a smaller width than that of a base end portion in a depth direction, on the insulating layer before forming a shield layer for covering the insulating layer, forming a shield layer by applying a conductive resin to be filled in the cut groove, and then dividing a substrate by cutting away thereof with a width that is larger than the width of the tip end portion and smaller than the width of the base end portion along the tip end portion of the cut groove). As disclosed in the document, examples of a method for forming a shield layer include a transfer mold method or potting method, a vacuum printing method, and the like. However, all of these methods require large-scale equipment and have a problem in that it is easy to entrain bubbles when a conductive resin is filled in a groove portion.

In addition, regarding a thickness of the shield layer, the shield layer is required to be thin from a viewpoint of miniaturization. Currently, for this, a technology for forming a shield layer with a film thickness of approximately 6 µm to 8 µm on a mold IC or package upper surface with a sputtering method is generally used and mass production is also realized. However, the technology has a problem in that the apparatus is expensive, the time required for formation of a shield layer is also long, the cost is high, and it is hard to form a coating film on a side surface of an electronic part.

In addition, in conventional conductive coating materials, other than using pure silver powders, it was difficult to obtain favorable conductivity and shielding properties in a case of a film thickness of 10 µm or less. In a case where conductivity is not obtained in a thin film, it is necessary to apply a conductive coating material thick. However, in a case where the conductive coating material is applied thick, drying of a solvent is slow. Thus, there is a case where the conductive coating material on a side surface is sagged so that the conductive coating material on a corner of a mold IC or package part becomes thin. In a portion in which the conductive coating material is thin, conductivity may not be obtained and thus the electromagnetic wave shield effect of the shield layer is not sufficient.

CITATION LIST

Patent Literature

[PTL 1] JP-A-2003-258137
[PTL 2] JP-A-2008-42152

SUMMARY OF INVENTION

Technical Problem

The present invention is made in view of the above matters, and an object of the present invention is to provide a conductive coating material that may be used to form a thin-film shield layer having favorable shielding properties and favorable adhesion to a package by spray coating, and may be used to form a coating film having favorable conductivity even in a case of a thin film of film thickness 10 µm or less. In addition, another object of the present invention is to provide a production method for a shielded package in which the above-described shield layer may be easily formed.

Solution to Problem

In view of the above matters, a conductive coating material of the present invention includes at least (A) 100 parts by mass of a binder component including a solid epoxy resin that is a solid at normal temperature and a liquid epoxy resin that is a liquid at normal temperature, (B) 500 to 1800 parts by mass of metal particles that have a tap density of 5.3 to 6.5 g/cm$^3$ with respect to 100 parts by mass of the binder component (A), (C) 0.3 to 40 parts by mass of a curing agent that contains at least one imidazole type curing agent with respect to 100 parts by mass of the binder component (A), and (D) 150 to 600 parts by mass of a solvent with respect to 100 parts by mass of the binder component (A).

The binder component (A) may contain 5 to 35 parts by mass of a solid epoxy resin that is a solid at normal temperature and 20 to 90 parts by mass of a liquid epoxy resin that is a liquid at normal temperature, provided that the total amount of the solid and liquid epoxy resins does not exceed 100 parts by mass.

In addition, the binder component (A) may further contain a (meth)acrylate compound.

The metal particles (B) may be flake shape.

The curing agent (C) may further contain at least one selected from the group consisting of a phenol type curing agent and a naphthol type curing agent.

The conductive coating material preferably has a viscosity of 100 mPa·s or greater as measured with a cone-plate rotary viscometer at 0.5 rpm. In addition, the viscosity measured using a single cylindrical rotary viscometer with rotor No. 5 at 10 rpm is preferably 15 dPa·s or less.

The conductive coating material is suitable for use in shielding an electronic part package.

According to the present invention, there is provided a method for producing a shielded package in which electronic parts are mounted on a substrate, and a package obtained by sealing the electronic parts with a sealing material is covered with a shield layer, the method including at least a step of mounting a plurality of electronic parts on a substrate and sealing the electronic parts by filling the substrate with a sealing material and curing thereof, a step of forming a groove portion by cutting away the sealing material between the plurality of electronic parts and individualizing a package of each electronic part on the substrate by the groove portion, a step of applying the conductive coating material of the present invention to a surface of the individualized package by spraying, a step of forming a shield layer by heating a package to which the conductive coating material is applied and curing the conductive coating material, and a step of obtaining a fragmented shielded package by cutting the substrate along the groove portion.

Advantageous Effects of Invention

According to the conductive coating material of the present invention, it is possible to ensure conductivity of the coating film even in a case of a thin film thickness of approximately 10 μm. Therefore, a solvent applied to the surface of a package by spraying dries fast, a coating film is thin and thus the coating film itself has a light weight, and uniformly thin conductive films are obtained on a side surface of the package and a corner portion of the package. Accordingly, it is possible to easily form a shield layer having an excellent shielding effect and excellent adhesion to the package. In addition, since the shield layer can be applied in the form of a thin film, it is also excellent in cost-saving.

In addition, according to the production method for a shielded package of the present invention, it is possible to efficiently produce a shielded package having excellent shielding properties and adhesion to the package as described above without using large-scale equipment.

REFERENCE SINGS LIST

Figure 1A:
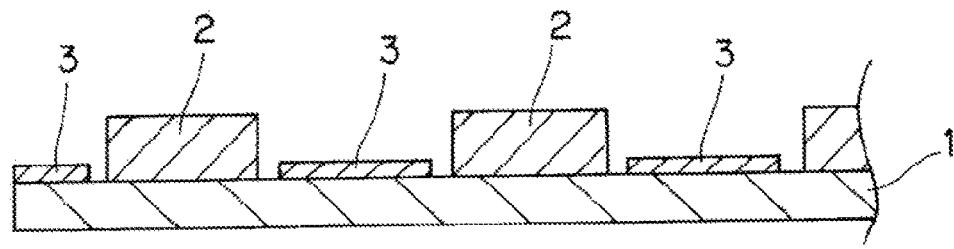
FIGS. 1(a) to 1(e) show perspective sectional views illustrating an embodiment of a production method for a shielded package.

A individualized package on a substrate
B fragmented shielded package
$B_1$, $B_2$, $B_9$ shielded package before fragmentation
1 substrate
2 electronic parts
3 ground circuit pattern (copper foil)
4 sealing material
5 conductive coating material (shield layer)
11 to 19 groove
21 copper pad
22 conductive coating film

DESCRIPTION OF EMBODIMENTS

As described above, a conductive coating material according to the present invention includes at least (A) 100 parts by mass of a binder component including a solid epoxy resin that is a solid at normal temperature and a liquid epoxy resin that is a liquid at normal temperature, and with respect to 100 parts by mass of the binder component (A), (B) 500 to 1800 parts by mass of metal particles that have a tap density of 5.3 to 6.5 g/cm$^3$, (C) 0.3 to 40 parts by mass of a curing agent that contains at least one imidazole type curing agent, and (D) 150 to 600 parts by mass of a solvent. The use of the conductive coating material is not particularly limited, but is suitable for use in obtaining a shielded package by spraying the conductive coating material in a vapor state by a spray and the like and forming the shield layer on a surface of a package before fragmentation or of a fragmented package.

A solid epoxy resin that is a solid at normal temperature and a liquid epoxy resin that is a liquid at normal temperature, both of which are capable of being used in the present invention, are not particularly limited as long as one or more epoxy groups are contained in the molecule. As examples thereof, listed are bisphenol type epoxy resins such as bisphenol A type epoxy resin, bisphenol F type epoxy resin, and bisphenol S type epoxy resin, spiro ring type epoxy resin, naphthalene type epoxy resin, biphenyl type epoxy resin, terpene type epoxy resin, glycidyl ether epoxy type resin such as tris (glycidyloxyphenyl) methan and tetrakis (glycidyloxyphenyl) ethane, glycidyl amine type epoxy resins such as tetraglycidyl diaminodiphenylmethane, tetrabrome bisphenol A type epoxy resin, novolac type epoxy resins such as cresol novolac type epoxy resin, phenol novolac type epoxy resin, α-naphthol novolac type epoxy resin, and brominated phenol novolac type epoxy resin, and rubber-modified epoxy resins. One type of these can be used alone, or two types of these can be used in combination.

As the epoxy resin, the epoxy resin that is a liquid at normal temperature and the epoxy resin that is a solid at normal temperature are preferably used in combination. A solid at normal temperature means a state of not having fluidity in a non-solvent state at 25° C. By using an epoxy resin that is a solid at normal temperature (hereinafter, referred to as "solid epoxy resin" in some cases), a conductive coating material capable of being uniformly applied to the surface of a package and forming a shield layer without any irregularity is obtained. The solid epoxy resin can be used by being dissolved in a solvent. The solvent to be used is not particularly limited and can be appropriately selected from those to be described later. In addition, a use amount of the solid epoxy resin is preferably in a range of 5 to 35 parts by mass in 100 parts by mass of a binder component. A use amount of the liquid epoxy resin is preferably in a range of 20 to 90 parts by mass in 100 parts by mass of the binder component.

In addition, the binder component of the present invention can further contain a (meth)acrylate compound. Here, the (meth)acrylate compound is an acrylate compound or methacrylate compound, and is not particularly limited as long as the compound has an acryloyl group or methacryloyl group. Examples of the (meth)acrylate compound include isoamyl acrylate, neopentyl glycol diacrylate, trimethylolpropane triacrylate, ditrimethylolpropane tetraacrylate, 2-hydroxy-3-acryloyloxypropyl methacrylate, phenylglycidyl ether acrylate hexamethylene diisocyanate urethane prepolymer, bisphenol A diglycidyl ether acrylic acid adduct, ethylene glycol dimethacrylate, diethylene glycol dimethacrylate, and the like. One type of these can be used alone or two types of these can be used in combination.

In a case of containing a (meth)acrylate compound as described above, a content ratio thereof is preferably 5 to 95 parts by mass in 100 parts by mass of a sum amount of the epoxy resin and the (meth)acrylate compound, and more preferably 20 to 80 parts by mass of the sum amount of the epoxy resin and the (meth)acrylate compound. If the (meth) acrylate compound is 5 parts by mass or greater, the conductive coating material has excellent storage reliability, the conductive coating material can be cured faster, and conductivity can also be improved. In addition, it is possible to prevent sagging of the coating material during curing. In addition, in a case where the (meth)acrylate compound is 95 parts by mass or less, adhesion between a package and a shield layer easily becomes favorable.

As the binder component, an alkyd resin, a melamine resin, a xylene resin, and the like can be added as a modifying agent, in addition to the epoxy resin and the (meth)acrylate compound, for the purpose of improving physical properties of the conductive coating material.

A content ratio in a case of blending a modifying agent to the binder component is preferably 40 parts by mass or less in 100 parts by mass of the binder component, and more preferably 10 parts by mass or less in 100 parts by mass of the binder component, from a viewpoint of adhesion between the conductive coating film and the object to be coated.

In the present invention, a curing agent for curing the binder component is used. As the curing agent, at least one imidazole type curing agent is used. In addition to this, at least one type selected from a phenol type curing agent and a naphthol type curing agent is preferably used. Furthermore, other curing agents, for example, an amine type curing agent, a cation type curing agent, a radical type curing agent, and the like, can be used. One type of the curing agent can be used alone or two types of the curing agents can be used in combination.

Examples of the imidazole type curing agent include imidazole, 2-undecylimidazole, 2-heptadecylimidazole, 2-methylimidazole, 2-ethylimidazole, 2-phenylimidazole, 2-ethyl-4-methyl-imidazole, 1-cyanoethyl-2-undecyl-imidazole, 1-cyanoethyl-2-methylimidazole, 1-cyanoethyl-2-undecyl-imidazolium trimellitate, 1-cyanoethyl-2-ethyl-4-methylimidazole, and the like.

The phenol type curing agent is a compound that has at least one phenol skeleton in a molecule and is able to be used as a curing agent of an epoxy resin. Examples of the phenol type curing agent include a phenol novolac (novolac type phenol resin), triphenyl methane type phenol resin, dicyclopentadiene type novolac resin, and the like. Thus, the phenol type curing agent is preferably a novolac type phenol resin.

The naphthol type curing agent is a compound that has at least one naphthol skeleton in a molecule and is able to be used as a curing agent of an epoxy resin. Examples of the naphthol type curing agent include a naphthol/cresol/formaldehyde resin, a phenol/naphthol-based aralkyl resin, a xylok type novolac resin, and the like.

Examples of the cation type curing agent include onium-based compounds represented by amine salt of boron trifluoride, P-methoxy benzene diazonium hexafluorophosphate, diphenyliodonium hexafluorophosphate, triphenylsulfonium, tetra-n-butylphosphonium tetraphenylborate, tetra-n-butylphosphonium-o,o-diethyl-phosphorodithioate.

Examples of the radical type curing agent (polymerization initiator) include di-cumyl peroxide, t-butyl cumyl peroxide, t-butyl hydroperoxide, cumene hydroperoxide, and the like.

The content of a curing agent is preferably 0.3 to 40 parts by mass, and more preferably 0.5 to 35 parts by mass, with respect to 100 parts by mass of a sum amount of the binder component. If the content of a curing agent is 0.3 parts by mass or greater, adhesion between a conductive coating film and the surface of the object to be coated and conductivity of the conductive coating film become favorable, and a conductive coating film having an excellent shielding effect is obtained. In addition, if the content of a curing agent is 40 parts by mass or less, storage reliability of a conductive coating material is improved. Moreover, in a case of using a radical type curing agent as a curing agent, the content of the radical type curing agent is preferably 0.3 to 8 parts by mass with respect to 100 parts by mass of a sum amount of the binder component. If the content of the radical type curing agent is 0.3 parts by mass or greater, adhesion between the conductive coating film and the surface of the object to be coated and conductivity of the conductive coating film become favorable, and a conductive coating film having an excellent shielding effect is obtained. In addition, if the content of the radical type curing agent is 8 parts by mass or less, storage reliability of a conductive coating material is improved.

Metal particles that can be used in the present invention are not particularly limited as long as the metal particles are particles having conductivity. Examples of the metal particles include copper particles, silver particles, nickel particles, silver-coated copper particles, gold-coated copper particles, silver-coated nickel particles, gold-coated nickel particles, and the like. From a viewpoint of excellent conductivity at a relatively low cost, silver-coated copper particles are preferable.

A tap density of the metal particles is preferably 5.3 to 6.5 g/cm$^3$. With the tap density being in the above-described range, a coating film with favorable conductivity can be formed while the coating film is a thin film.

A shape of the metal particles is not particularly limited, but flake shape (scale shape) is preferable from a viewpoint that application reliability of the conductive coating material is higher, a resistance value of an obtained conductive coating film is lower, and a conductive coating film with improved shielding properties is obtained.

In addition, in a case where the metal particles are flake shape, an aspect ratio of the metal particles is preferably 2 to 10. If the aspect ratio is in the above-described range, conductivity of a shield layer is more favorable.

The content of the metal particles is preferably 500 to 1800 parts by mass with respect to 100 parts by mass of the binder component. If the content of the metal particles is 500 parts by mass or greater, conductivity of the thin-film shield layer becomes favorable, and if the content of the metal particles is 1800 parts by mass or less, adhesion between the shield layer and the package as well as physical properties of the conductive coating material after curing become favorable and chipping of the shield layer when performing cutting with a dicing saw to be described later is less likely to occur.

In addition, an average particle diameter of the metal particles is preferably 1 to 300 μm. If the average particle diameter of the metal particles is 1 μm or greater, dispersibility of the metal particles is favorable and thus coagulation can be prevented, and oxidation is less likely to occur. If the average particle diameter of the metal particles is 300 μm or less, connectivity of the package to a ground circuit is favorable.

The conductive coating material of the present invention is preferably of low viscosity by containing a larger amount of a solvent than a so-called conductive paste so that the conductive coating material can be uniformly applied to the surface of the package by spraying.

The solvent used in the present invention is not particularly limited, and examples of the solvent include methyl ethyl ketone, acetone, acetophenone, methyl cellosolve, methyl cellosolve acetate, methyl carbitol, diethylene glycol dimethyl ether, tetrahydrofuran, dioxyter, methyl acetate, butyl acetate, and the like. One type of the solvent can be used alone or two types of the solvents can be used in combination.

The content of the solvent is preferably appropriately adjusted depending on the use of the conductive coating material, the equipment used for coating, and the like, but is preferably 150 to 600 parts by mass with respect to 100 parts by mass of the binder component, in general. If the content of the solvent is 150 parts by mass or greater, a thin conductive coating film with a thickness of 10 μm is obtained, and reliable spray coating properties can be realized. In addition, if the content of the solvent is 600 parts by mass or less, a shield layer can be formed on a surface of the package without any irregularity, and reliable shielding properties are easily obtained.

The conductive coating material of the present invention can be added with known additives such as anti-foaming agent, viscosity agent, adhesive agent, filling agent, flame retardant, and coloring agent, in a range of not impairing the object of the invention.

It is preferable that a viscosity of the conductive coating material of the present invention is measured with a cone-plate rotary viscometer (so-called cone-plate viscometer) if the viscosity is low, and is measured with a single cylindrical rotary viscometer (so-called B type or BH type viscometer) if the viscosity is high.

In a case where the viscosity is measured with the cone-plate rotary viscometer, the viscosity measured at 0.5 rpm using a cone spindle CP40 (cone angle: 0.8°, cone semi-diameter: 24 mm) of Brookfield Engineering is preferably 100 mPa·s or greater, and more preferably 150 mPa·s or greater. If the viscosity is 100 mPa·s or greater, liquid sagging is prevented in a case where the surface to be coated is not horizontal, and thus a thin conductive coating film is easily formed without any irregularity. As long as the viscosity is a viscosity measurable with the cone-plate rotary viscometer, there is no problem even if the viscosity is high.

In a case where the viscosity is measured with the single cylindrical rotary viscometer, the viscosity measured at 10 rpm using Rotor No. 5 is preferably 15 dPa·s or less, and more preferably 13 dPa·s or less. If the viscosity is 15 dPa·s or less, clogging of a spray nozzle is prevented, and a thin conductive coating film is easily formed uniformly without any irregularity. As long as the viscosity is a viscosity measurable with the single cylindrical rotary viscometer, there is no problem even if the viscosity is low.

A method for forming a conductive coating film using the conductive coating material of the present invention is not particularly limited but following method can be used. That is, a conductive coating material is sprayed in a mist form by using a known spray coating device such as spray and spray gun, and thoroughly applied to the surface of the object to be coated. A spray pressure or spray flow rate, and a distance between a nozzle tip end and the object to be coated at this time can be appropriately adjusted depending on the necessity. Subsequently, after heating the object to be coated to which the conductive coating material is applied depending on the necessity and sufficiently drying a solvent, by performing further heating and sufficiently curing a binder component in the conductive coating material, a conductive coating film is obtained. A heating temperature and a heating time at this time can be appropriately adjusted by the type of the binder component or a curing agent and the like.

In a case where the conductive coating material of the present invention is used in a package shield, a shield layer obtained from the conductive coating material is excellent in adhesion to a ground circuit formed of a copper foil and the like. Specifically, since adhesion between a copper foil of the ground circuit exposed from a portion of the package and the shield layer is favorable, when fragmenting the package by cutting the package after forming the shield layer by applying the conductive coating material to the surface of the package, it is possible to prevent the shield layer from being exfoliated from the ground circuit due to impact at the time of cutting.

Regarding the adhesion between the conductive coating material and the copper foil in the case where the conductive coating material of the present invention is used in shielding a package, a shear strength measured based on JIS K 6850: 1999 is preferably 3.0 MPa or greater. If the shear strength is 3.0 MPa or greater, there is almost no concern that the shield layer is exfoliated from the ground circuit due to impact at the time of cutting the package before fragmentation.

A sheet resistance value of the shield layer formed with the conductive coating material of the present invention is preferably 100 mΩ/□ or less at a thickness of a coating film of 10 μm. If the sheet resistance value is 100 mΩ/□ or less, shielding properties become favorable.

Subsequently, an embodiment of a method for obtaining a shielded package by using the conductive coating material of the present invention is described by using drawings.

First, as illustrated in FIG. 1(a), a plurality of electronic parts (IC and the like) 2 are mounted on a substrate 1, and a ground circuit pattern (copper foil) 3 is provided between the plurality of electronic parts 2.

Figure 1B:
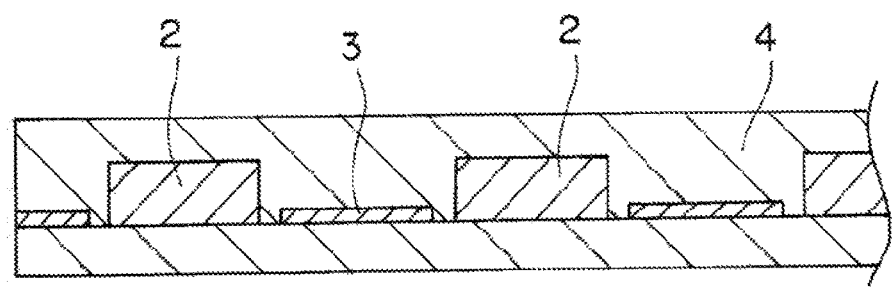

Subsequently, as illustrated in FIG. 1(b), a sealing material 4 is filled on the electronic parts 2 and the ground circuit pattern 3 and cured to seal the electronic parts 2 and the ground circuit pattern 3.

Figure 1C:
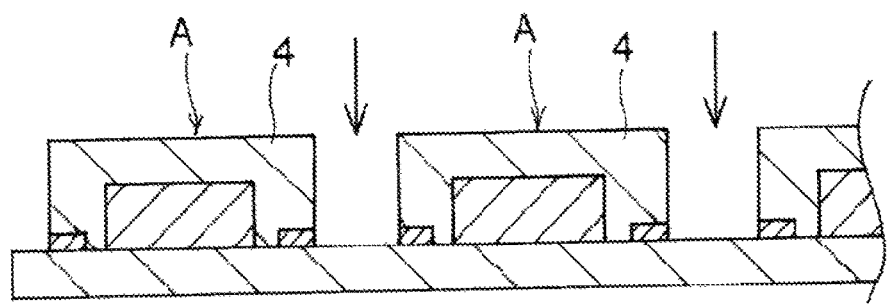

Subsequently, as illustrated with an arrow in FIG. 1(c), the sealing material 4 is cut away between the plurality of electronic parts 2 to form a groove portion, and each of packages of the electronic parts in the substrate 1 is individualized due to the groove portion. Reference sign A represents each of individualized packages. At least a portion of the ground circuit is exposed from a wall surface constituting the groove, and a bottom portion of the groove does not completely penetrate the substrate.

On the other hand, the above-described epoxy resin, a (meth)acrylate compound used depending on the necessity, metal particles, a solvent, and a curing agent are mixed with a modifying agent depending on the necessity at a predetermined mixture ratio to prepare a conductive coating material.

Subsequently, the conductive coating material is sprayed in a mist form with an optional spray coating device, and thoroughly applied such that the surface of the package and the ground circuit exposed from a wall surface are covered with the conductive coating material. A spray pressure or spray flow rate, and a distance between a nozzle tip end and a surface of the package at this time can be appropriately set depending on the necessity.

Figure 1D:
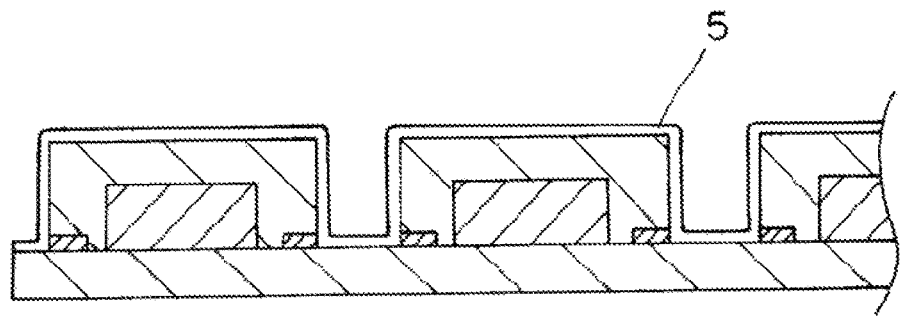
Figure 2:
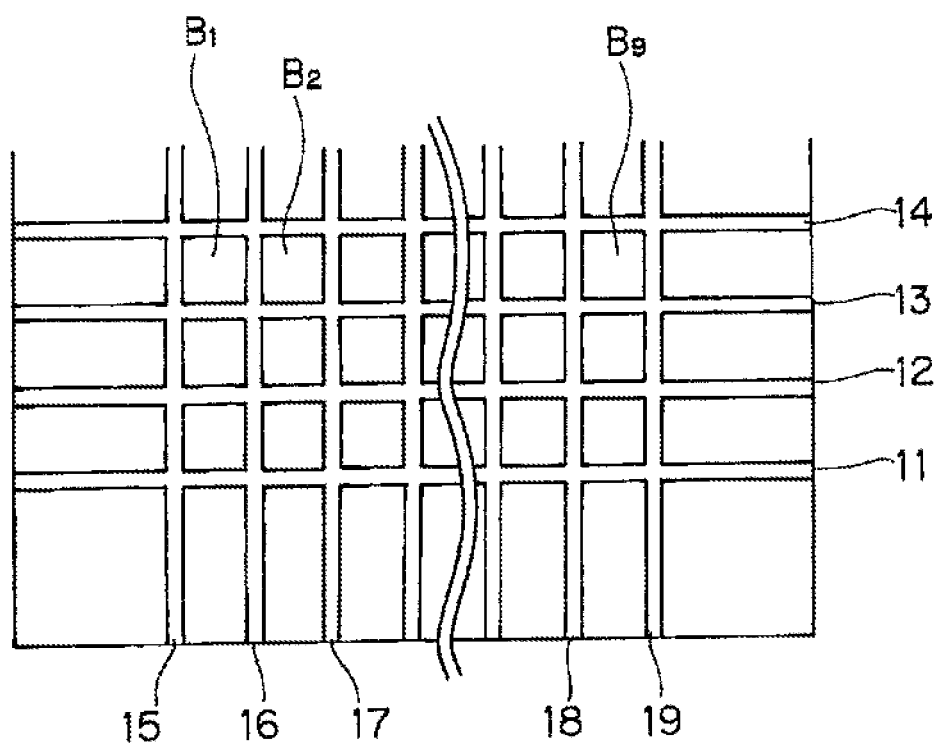
FIG. 2 is a plan view illustrating an example of a shielded package before fragmentation.

Subsequently, after heating the package to which the conductive coating material is applied and sufficiently drying the solvent, by performing further heating and sufficiently curing a binder component in the conductive coating material, a shield layer 5 is formed on a surface of the package as illustrated in FIG. 1(d). Heating conditions at this time can be appropriately set. FIG. 2 is a plan view illustrating the substrate in this state. Reference signs $B_1$, $B_2$, . . . $B_9$ illustrate a shielded package before fragmentation, respectively, and reference signs 11 to 19 represent a groove between these shielded packages, respectively.

Figure 1E:
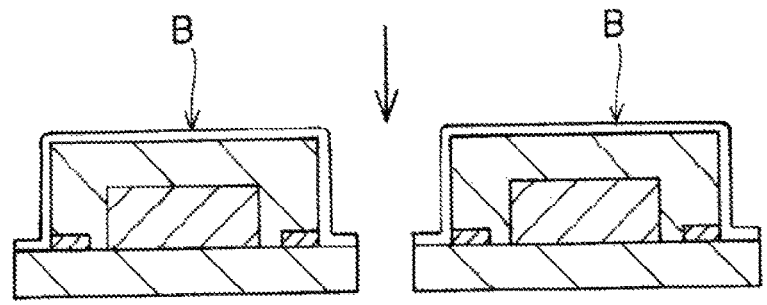

Subsequently, as illustrated with an arrow in FIG. 1(e), by cutting the substrate with a dicing saw and the like along a bottom portion of a groove between packages, a fragmented package B is obtained.

In the fragmented package B obtained in such a manner, a uniform shield layer is formed on the surface of the package (any of an upper surface portion, a side surface portion, and corner portions of a boundary between the upper surface portion and the side surface portion), and thus favorable shielding properties are obtained. In addition, since adhesion between the shield layer and the surface of the package and the ground circuit is excellent, it is possible to prevent the shield layer from being exfoliated from the surface of the package or the ground circuit due to impact at the time of fragmenting the package with a dicing saw and the like.

In the conductive coating film according to the present invention, favorable conductivity can be obtained even in a case of a thickness of 10 μm or so. Therefore, the conductive coating film according to the present invention is advantageous in that the conductive coating film can be used without changing conventional design, for example, size of the shielded package and the like, and the conductive coating film is applied in a small amount and thus it is also excellent in cost-saving.

EXAMPLES

Hereinafter, the content of the present invention will be described in detail based on examples, but the present invention is not limited to the following. In addition, hereinafter, "part" or "%" is based on mass unless particularly mentioned.

1. Preparation and Evaluation of Conductive Coating Material

Examples, Comparative Examples

A curing agent, metal particles, and a solvent were mixed at a ratio described in Table 1 with respect to 100 parts by mass of a binder component containing an epoxy resin to obtain a conductive coating material. The details of each of the used components are as follows.

Solid epoxy resin: manufactured by Mitsubishi Chemical Corporation, product name "JER157S70"

Liquid epoxy resin 1: glycidyl amine-based epoxy resin, manufactured by ADEKA Corporation, product name "EP-3905S"

Liquid epoxy resin 2: glycidyl ether-based epoxy resin, manufactured by ADEKA Corporation, product name "EP-4400"

(Meth)acrylate resin: 2-hydroxy-3-acryloyloxypropyl methacrylate, manufactured by Kyoeisha Chemical Co., Ltd., product name "Light Ester G-201P"

Curing agent 1: Phenol novolac, manufactured by Arakawa Chemical Industries, Ltd., product name "Tamanol 758"

Curing agent 2: 1-cyanoethyl-2-methylimidazole, manufactured by Shikoku Chemicals Corporation, product name "2MZ-CN"

Curing agent 3: naphthol type curing agent, manufactured by Gun Ei Chemical Industry Co., Ltd., product name "GPNX-70HN"

Comparative curing agent: amine type curing agent, manufactured by Ajinomoto Fine-Techno Co., Inc., product name "Ajicure PN-23"

Solvent: butyl acetate

Metal particles: flake-like silver-coated copper powder, silver coat amount of 5% by mass, average particle diameter of 5 μm, tap density of 6.3 g/cm$^3$, 5.6 g/cm$^3$, 5.3 g/cm$^3$, 5.0 g/cm$^3$ (1) Viscosity Measurement of the viscosity of the conductive coating material (liquid temperature of 25° C.) obtained in the above-described examples and comparative examples was performed with a TVB-10 viscometer or a cone-plate rotary viscometer. The measurement with the TVB-10 viscometer was performed at 10 rpm using a spindle No. 5. The measurement with the cone-plate rotary viscometer was performed at 0.5 rpm using "Programmable Viscometer DV-II+Pro" (product name) and a cone spindle CP40 of Brookfield Engineering. The measured viscosities are shown in Table 1. The signs "-" in the columns of viscosity show that the viscosity was not measurable with the viscometer.

(2) Conductivity of Conductive Coating Film

Figure 3:
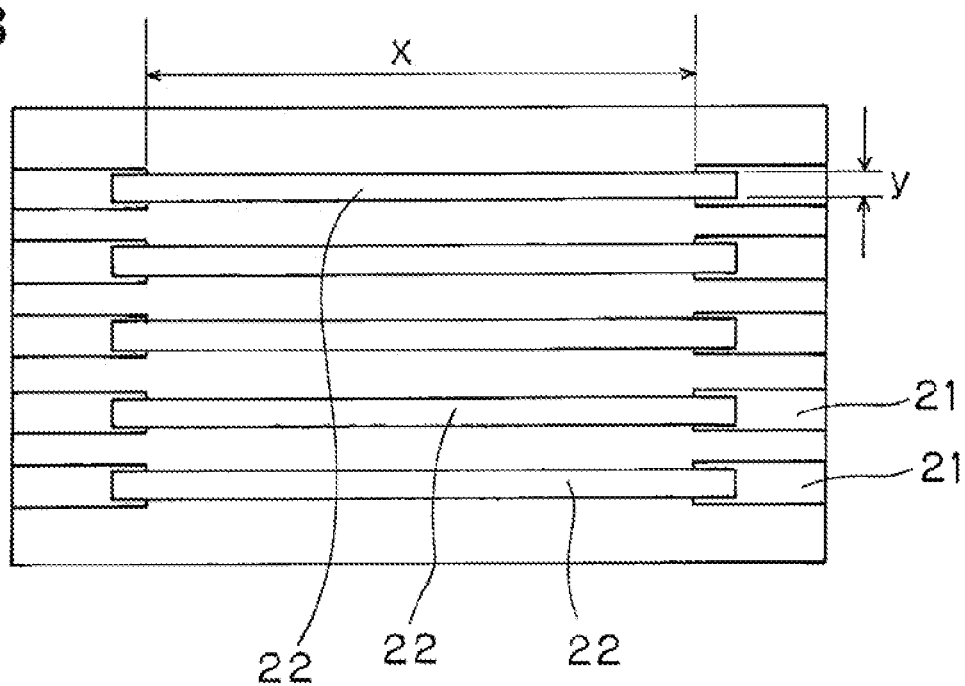
FIG. 3 is a perspective view of a cured product sample on which a conductive coating film is formed, used for a conductivity test of a conductive coating material.

As illustrated in FIG. 3, masking was performed using a polyimide tape on areas other than the coating areas of a glass epoxy substrate provided with a copper pad 21, the conductive coating material obtained in each of the examples and the comparative examples was applied using a hand spray (manufactured by Anest Iwata Corporation, LPH-101A-144LVG), pre-heated at 80° C. for 60 minutes, and then finally cured by heating at 160° C. for 60 minutes. The polyimide film was removed, so that a conductive coating film 22 having a length (x in FIG. 3) of 60 mm between copper pads 21, a width (y in FIG. 3) of 5 mm, and a thickness of 10 μm was obtained. For the cured product sample, the resistance value R of both ends was measured using a tester, and sheet resistance represented by the following equation (1) was calculated. The test was performed at N=5, and the average value was obtained. A sheet resistance of 100 mΩ/□ or less was determined to be good conductivity.

$$\text{Sheet resistance } (\Omega/\square) = (0.5 \times R)/6 \quad (1)$$

(3) Thin Film Coating Properties

Regarding the obtained cured product sample as described above, the thickness of the glass epoxy substrate in the portion from which the polyimide film was removed and the thickness of the glass epoxy substrate being adjacent to the removed portion and having the conductive coating film 22 formed thereon were measured with a micrometer, respectively, and the former was subtracted from the latter to calculate the thickness of the conductive coating film 22. The material with a low viscosity was applied repeatedly to form a film with a thickness of 10 µm. However, the material that formed a film with a thickness of 12 µm or more after one time application was denoted by "bad".

(4) Uniformity of Thickness of Shield Layer

Using a glass epoxy substrate (FR-4), a dummy chip of a width of 15 mm×a length of 15 mm×a thickness of 1 mm was prepared. Half of the dummy chip was masked with a polyimide film, fixed in a grid form at an interval of 10 mm using an adhesive tape, and a spray coating test was performed using a hand spray device (manufactured by Anest Iwata Corporation, "LPH-101A-144LVG") while half of the dummy chip was mounted on a rotary table and rotated at 160 rpm. After the spray coating, a solvent was dried off at 80° C. for 60 minutes, and the coating was cured by heating at 160° C. for 60 minutes. Uniformity of the coating film after the curing was evaluated.

Specifically, the thickness of the dummy chip in the portion from which the polyimide film was removed and the thickness of the dummy chip being adjacent to the removed portion and having the conductive coating film formed thereon were measured with a micrometer, respectively, and the former was subtracted from the latter to calculate the thickness of the conductive coating film on the upper surface. The measurement of the film thickness on the upper surface was performed at any three points. The measurement of the film thickness on the side surface was performed at one point, and the film thickness was defined as (measurement value of a coating film formation portion—measurement value of adjacent non-coating portion)×½. The test was performed at N=5, and the average value was obtained.

Evaluation of uniformity of the thickness was performed with a numerical value obtained by the following Equation (2) from the measurement values of the thicknesses of the upper surface and the side surface. A thickness uniformity value of 75% or greater was denoted by "good".

$$\text{Uniformity of thickness (\%)} = (\text{thickness of side surface}/\text{thickness of upper surface}) \times 100 \quad (2)$$

(5) Adhesion of Conductive Coating Material (Measurement of Shear Strength Before and after Solder Dip)

For evaluation of adhesion between a shield layer and the surface of a package or a ground circuit, a shear strength was measured based on JIS K 6850: 1999. Specifically, a conductive coating material was applied to an area of a length of 12.5 mm of a copper plate of width 25 mm×length 100 mm×thickness 1.6 mm and allowed to stand at normal temperature for 5 minutes. After the solvent was dried off, a copper plate of width 25 mm×length 100 mm×thickness 1.6 mm was attached thereto. Subsequently, the copper plates were bonded by heating at 80° C. for 60 minutes and further heating at 160° C. for 60 minutes. Subsequently, the bonded surfaces were pulled in parallel using a tensile strength tester (manufactured by Shimadzu Corporation, product name "Autograph AGS-X"), and the maximum load at the time of breaking was divided by the adhesion area to calculate the shear strength. A shear strength of 3.0 MPa or greater indicates that the material is usable without any problem.

In each example, the shear strength was 3.0 MPa or greater, and it was found that the material was advantageously usable for a shield layer.

In addition to the above, adhesion after solder dip was evaluated. A package is exposed to a high temperature in the solder dip process. For this reason, adhesion between a shield layer and the surface of the package or a ground circuit after exposure to a high temperature is also important. Thus, for measurement of adhesion after solder dip, the conductive coating material was applied to the copper plate, the plates were bonded and heated at 80° C. for 60 minutes, and then the conductive coating material was cured by heating at 160° C. for 60 minutes, as described above. Subsequently, the shear strength after heating at 260° C. for 30 seconds was measured. The method for measuring the shear strength is as described above.

A shear strength of 3.0 MPa or greater after solder dip indicates that the material is usable for a shield layer without any problem. In each example, the shear strength of the conductive coating material was 3.0 MPa or greater, and it was found that the material was advantageously usable for a shield layer.

In the evaluation method described above, the conductive coating material was applied under the following conditions.

<Spray Conditions>

Flow rate: 200 L/minute

Supply pressure: 0.5 Pa

Distance from the object to be coated: approximately 150 mm

Application time: 2 seconds×1 to 4 times

TABLE 1

| | | | Example | | | | | | | | | | | | Comparative Example | | | |
|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 1 | 2 | 3 | 4 |
| | Solid epoxy resin (parts by mass) | | 15 | 15 | 15 | 15 | 15 | 15 | 15 | 15 | 15 | 7 | 28 | 20 | 15 | 15 | 15 | 15 |
| | Liquid epoxy resin (parts by mass) | | 35 | 35 | 35 | 35 | 35 | 35 | 35 | 35 | 35 | 43 | 22 | 80 | 35 | 35 | 35 | 35 |
| Items | Liquid epoxy resin 1 | Glycidyl amine-based epoxy resin | 10 | 10 | 10 | 10 | 10 | 10 | 10 | 10 | 10 | 10 | 10 | 30 | 10 | 10 | 10 | 10 |
| | Liquid epoxy resin 2 | Glycidyl ether-based epoxy resin | 25 | 25 | 25 | 25 | 25 | 25 | 25 | 25 | 25 | 33 | 12 | 50 | 25 | 25 | 25 | 25 |
| | (Meth)acrylate compound (parts by mass) | | 50 | 50 | 50 | 50 | 50 | 50 | 50 | 50 | 50 | 50 | 50 | 0 | 50 | 50 | 50 | 50 |
| | Curing agent (parts by mass) | | 20 | 20 | 20 | 20 | 20 | 20 | 20 | 20 | 20 | 20 | 20 | 20 | 20 | 20 | 20 | 20 |
| Items | Curing agent 1 | Phenol type curing agent | | 15 | 15 | 15 | 15 | 15 | 15 | 15 | 15 | 15 | 15 | | 15 | 15 | 15 |

TABLE 1-continued

|  |  | Example | | | | | | | | | | | | Comparative Example | | | |
|---|---|---|---|---|---|---|---|---|---|---|---|---|---|---|---|---|---|
|  |  | 1 | 2 | 3 | 4 | 5 | 6 | 7 | 8 | 9 | 10 | 11 | 12 | 1 | 2 | 3 | 4 |
| Curing agent 2 | Imidazole type curing agent | 20 | 5 | 5 | 5 | 5 | 5 | 5 | 5 | 5 | 5 | 5 | 5 |  | 5 | 5 | 5 |
| Curing agent 3 | Naphthol type curing agent |  | 15 |  |  |  |  |  |  |  |  |  |  |  |  |  |  |
| Comparative curing agent | Amine type curing agent |  |  |  |  |  |  |  |  |  |  |  |  | 20 |  |  |  |
| Solvent (parts by mass) butyl acetate |  | 250 | 250 | 250 | 160 | 250 | 250 | 570 | 580 | 160 | 250 | 250 | 250 | 250 | 250 | 620 | 130 |
| Metal particles (parts by mass) | Flake shape 1 (tap density) 6.3 g/cm³ |  |  |  |  | 900 |  |  |  |  |  |  |  |  |  |  |  |
|  | Flake shape 2 (tap density 5.6 g/cm³) | 900 | 900 | 900 | 550 |  |  | 1700 | 900 | 1250 | 900 | 900 | 900 | 900 |  | 450 | 1900 |
|  | Flake shape 3 (tap density 5.3 g/cm³) |  |  |  |  |  | 900 |  |  |  |  |  |  |  |  |  |  |
|  | Flake shape 4 (tap density 5.0 g/cm³) |  |  |  |  |  |  |  |  |  |  |  |  |  | 900 |  |  |
| Cone-plate rotary viscometer CP40 0.5 rpm (mPa · S) |  | 182 | 207 | 198 | 225 | 153 | 243 | 280 | 113 | — | 177 | 256 | 215 | 281 | 320 | 20 | — |
| Single cylindrical rotary viscometer Rotor No.5 10 rpm (dPa · S) |  | — | — | — | — | — | — | — | — | 12 | — | — | — | — | — | — | 110 |
| Conductivity (sheet resistance, mΩ/□) |  | 97 | 82 | 81 | 97 | 96 | 95 | 89 | 83 | 98 | 88 | 93 | 95 | 177 | 136 | 95 | — |
| Thin film coating properties |  | good | good | good | good | good | good | good | good | good | good | good | good | good | good | good | bad |
| Uniformity of thickness of shield layer |  | good | good | good | good | good | good | good | good | good | good | good | good | good | good | bad | — |
| Spray coating conditions (seconds/number of times) |  | 2/2 | 2/2 | 2/2 | 2/2 | 2/2 | 2/2 | 2/2 | 2/3 | 2/1 | 2/2 | 2/2 | 2/2 | 2/2 | 2/2 | 2/4 | 2/1 |
| Adhesion of conductive coating film (shear strength, MPa) | Before solder dip | 5.3 | 7.8 | 7.5 | 7.8 | 7.7 | 7.3 | 6.4 | 7.6 | 7.3 | 7.7 | 7.9 | 7.2 | 6.6 | 7 | 6.1 | 2 |
|  | After solder dip | 4.7 | 7.7 | 7.1 | 7.6 | 7.6 | 7.1 | 6.3 | 7.1 | 7.3 | 7.5 | 7.8 | 7 | 6.2 | 6.8 | 5 | 1.7 |

Table 1 shows the results. When the conductive coating material of each example was used, the sheet resistance was 100 mΩ/□ or less, and the thin film coating properties, the uniformity of the thickness of the shield layer, and the adhesion of the conductive coating film were excellent in each case.

In Comparative Example 1, since an imidazole type curing agent was not contained, the conductivity was inferior.

In Comparative Example 2, since the tap density of the contained metal particles was not between 5.3 to 6.5 g/cm³, the conductivity was inferior.

In Comparative Example 3, since the content of the metal particles was less than 500 parts by mass and the content of the solvent was greater than 600 parts by mass, the viscosity was very low and a shield layer having a uniform thickness was not obtained.

In Comparative Example 4, since the content of the metal particles was greater than 1800 parts by mass and the content of the solvent was less than 150, the viscosity was too high, and the thin film coating properties and the adhesion of the conductive coating film were inferior. Since a thin-film shield layer was not obtained, the conductivity and the uniformity of the thickness of the shield layer were not measured.

The present international application claims priority based on Japanese Patent Application No. 2016-066379 which is a Japanese patent application filed on Mar. 29, 2016, and the entire content of Japanese Patent Application No. 2016-066379 which is the Japanese patent application is employed in the present international application.

The description on the specific embodiments of the present invention is presented as examples. The described embodiments themselves are not intended to be exhaustive or to limit the present invention. It is obvious for those skilled in the art that various modifications or changes are possible in view of the above described content.

The invention claimed is:

1. A conductive coating material comprising at least:
(A) 100 parts by mass of a binder component including a solid epoxy resin that is a solid at normal temperature and a liquid epoxy resin that is a liquid at normal temperature;
(B) 500 to 1800 parts by mass of metal particles that have a tap density of 5.3 to 6.5 g/cm³ with respect to 100 parts by mass of the binder component (A);
(C) 0.3 to 40 parts by mass of a curing agent that contains at least one imidazole type curing agent with respect to 100 parts by mass of the binder component (A); and
(D) 150 to 600 parts by mass of a solvent with respect to 100 parts by mass of the binder component (A)
wherein the curing agent (C) further contains a naphthol type curing agent, wherein the solid epoxy resin is selected from the group consisting of bisphenol type epoxy resins, spiro ring type epoxy resin, naphthalene type epoxy resin, biphenyl type epoxy resin, terpene type epoxy resin, glycidyl ether epoxy type resin, glycidyl amine type epoxy resins, novolac type epoxy resins, rubber-modified epoxy resins, and combinations thereof, and the liquid epoxy resin is glycidyl amine type epoxy resins and/or glycidyl ether type epoxy resins.

2. The conductive coating material according to claim 1, wherein the binder component (A) contains 5 to 35 parts by mass of a solid epoxy resin that is a solid at normal temperature and 20 to 90 parts by mass of a liquid epoxy resin that is a liquid at normal temperature, provided that the total amount of the solid and liquid epoxy resins does not exceed 100 parts by mass.

3. The conductive coating material according to claim 2, wherein the binder component (A) further contains a (meth)acrylate compound.

4. The conductive coating material according to claim 2, wherein the metal particles (B) are flake shape.

5. The conductive coating material according to claim 2, which has a viscosity of 100 mPa·s or greater as measured with a cone-plate rotary viscometer at 0.5 rpm.

6. The conductive coating material according to claim 2, which has a viscosity of 15 dPa·s or less as measured using a single cylindrical rotary viscometer with rotor No. 5 at 10 rpm.

7. The conductive coating material according to claim 1, wherein the binder component (A) further contains a (meth)acrylate compound.

8. The conductive coating material according to claim 7, wherein the metal particles (B) are flake shape.

9. The conductive coating material according to claim 7, which has a viscosity of 100 mPa·s or greater as measured with a cone-plate rotary viscometer at 0.5 rpm.

10. The conductive coating material according to claim 7, which has a viscosity of 15 dPa·s or less as measured using a single cylindrical rotary viscometer with rotor No. 5 at 10 rpm.

11. The conductive coating material according to claim 1, wherein the metal particles (B) are flake shape.

12. The conductive coating material according to claim 1, which has a viscosity of 100 mPa·s or greater as measured with a cone-plate rotary viscometer at 0.5 rpm.

13. The conductive coating material according to claim 1, which has a viscosity of 15 dPa·s or less as measured using a single cylindrical rotary viscometer with rotor No. 5 at 10 rpm.

14. The conductive coating material according to claim 1, which is for use in shielding an electronic part package.

15. A method for producing a shielded package in which electronic parts are mounted on a substate, and a package obtained by sealing the electronic parts with a sealing material is covered with a shield layer, the method comprising at least:

a step of mounting a plurality of electronic parts on the substate and sealing the electronic parts by filling the substate with a sealing material and curing thereof;

a step of forming a groove portion by cutting away the sealing material between the plurality of electronic parts and individualizing the package of each electronic part on the substate by the groove portion;

a step of applying the conductive coating material according to claim 10 to a surface of the individualized package by spraying;

a step of forming the shield layer by heating the package to which the conductive coating material is applied and curing the conductive coating material; and a step of obtaining a fragmented shielded package by cutting the substate along the groove portion.

16. A method for producing a shielded package according to claim 15, wherein the binder component (A) contains 5 to 35 parts by mass of a solid epoxy resin that is a solid at normal temperature and 20 to 90 parts by mass of a liquid epoxy resin that is a liquid at normal temperature, provided that the total amount of the solid and liquid epoxy resins does not exceed 100 parts by mass.

17. A method for producing a shielded package according to claim 15, wherein the binder component (A) further contains a (meth)acrylate compound.

* * * * *